United States Patent
Oh et al.

(10) Patent No.: US 10,796,737 B1
(45) Date of Patent: Oct. 6, 2020

(54) SEMICONDUCTOR APPARATUS CAPABLE OF SYNCHRONIZING COMMAND SIGNAL AND CLOCK SIGNAL, AND OPERATION METHOD THEREOF

(71) Applicant: SK hynix Inc., Icheon-si, Gyeonggi-do (KR)

(72) Inventors: Seung Wook Oh, Yongin-si (KR); Young Suk Seo, Seoul (KR); Da In Im, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/725,174

(22) Filed: Dec. 23, 2019

(30) Foreign Application Priority Data

Jul. 5, 2019 (KR) .................. 10-2019-0081254

(51) Int. Cl.
*G11C 7/10* (2006.01)
*H03K 5/135* (2006.01)
*G11C 7/22* (2006.01)
*G11C 8/10* (2006.01)

(52) U.S. Cl.
CPC .......... *G11C 7/1066* (2013.01); *G11C 7/222* (2013.01); *G11C 8/10* (2013.01); *H03K 5/135* (2013.01)

(58) Field of Classification Search
CPC ...... H03K 5/135; G11C 7/222; G11C 7/1066; G11C 8/10
See application file for complete search history.

(56) References Cited

U.S. PATENT DOCUMENTS

| | | | | |
|---|---|---|---|---|
| 9,531,363 B2* | 12/2016 | Miyano | ............... | H03K 5/135 |
| 9,865,317 B2* | 1/2018 | Ishibashi | ............ | G11C 11/4076 |
| 9,959,917 B2* | 5/2018 | Lee | ......... | G11C 7/222 |
| 10,403,340 B2* | 9/2019 | Komatsu | ............. | G11C 7/1066 |
| 10,607,671 B2* | 3/2020 | Chen | ...................... | G06F 13/18 |

FOREIGN PATENT DOCUMENTS

KR       1020160029391 A       3/2016

* cited by examiner

*Primary Examiner* — Patrick O Neill
(74) *Attorney, Agent, or Firm* — William Park & Associates Ltd.

(57) ABSTRACT

A semiconductor apparatus includes a clock path, a command path, a delay monitoring circuit, and an output control circuit. The clock path generates a delay clock signal by delaying a clock signal. The command path generates an output command signal from on one of a command signal and the clock signal, based on a monitoring signal. The delay monitoring circuit generates a delay control signal and a latency control signal based on a phase difference between the delay clock signal and the output command signal, when the monitoring signal is enabled. The output control circuit generates an output enable signal by synchronizing the output command signal with the delay clock signal, based on the latency control signal.

25 Claims, 9 Drawing Sheets

SEMICONDUCTOR APPARATUS CAPABLE OF SYNCHRONIZING COMMAND SIGNAL AND CLOCK SIGNAL, AND OPERATION METHOD THEREOF

CROSS-REFERENCES TO RELATED APPLICATION

The present application claims priority under 35 U.S.C. § 119(a) to Korean application number 10-2019-0081254, filed on Jul. 5, 2019, in the Korean Intellectual Property Office, which is incorporated herein by reference in its entirety.

BACKGROUND

1. Technical Field

Various embodiments generally relate to an integrated circuit technology, and more particularly, to a semiconductor apparatus which can operate in synchronization with a clock signal.

2. Related Art

An electronic device may include many electronic components. Among the electronic components, a computer system may include a large number of semiconductor apparatuses composed of semiconductors. The semiconductor apparatuses constituting the computer system may communicate with each other by transmitting and receiving clock signals and data. The semiconductor apparatuses may operate in synchronization with a clock signal. The semiconductor apparatuses may internally generate various signals based on a signal received from an external device. The various signals may be delayed and generated by internal circuits of the semiconductor apparatuses. The delay may include synchronous delay and asynchronous delay. For example, a memory apparatus, such as a DRAM (Dynamic Random Access Memory), may generate internal signals by using the synchronous delay for data and clock signals, signals related to the data, and generate internal signals by using the asynchronous delay for control signals, such as a command signal and address signal, other than signals related to the data. However, when receiving or outputting data, the semiconductor apparatuses need to perform an operation of synchronizing the internal signals generated through the asynchronous delay with the clock signal again. Such an operation may be referred to as domain crossing. However, when there is a large difference between the synchronous delay and the asynchronous delay, it is difficult to accurately perform domain crossing.

SUMMARY

In an embodiment, a semiconductor apparatus may include a clock path, a command path, a delay monitoring circuit, and an output control circuit. The clock path may be configured to generate a delay clock signal by delaying a clock signal. The command path may be configured to generate an output command signal from one of a command signal and the clock signal, based on a monitoring signal. The delay monitoring circuit may be configured to generate a delay control signal and a latency control signal based on a phase difference between the delay clock signal and the output command signal, when the monitoring signal is enabled. The output control circuit may be configured to generate an output enable signal by synchronizing the output command signal with the delay clock signal, based on the latency control signal.

In an embodiment, a semiconductor apparatus may include a clock path, a command path, a delay monitoring circuit, and an output control circuit. The clock path may be configured to generate a delay clock signal by delaying a clock signal, and configured to perform a first delay locking operation and a second delay locking operation on the clock signal. The command path may be configured to generate an internal command signal by decoding a command signal, and configured to generate an output command signal by delaying the internal command signal. The delay monitoring circuit is may be configured to generate a delay control signal and a latency control signal by monitoring a difference in delay amount between the clock path and the command path. The output control circuit may be configured to generate an output enable signal by synchronizing the output command signal with the delay clock signal, based on the latency control signal.

In an embodiment, an operation method of a semiconductor apparatus may include generating a delay control signal and a latency control signal by monitoring a difference in delay amount between a clock path and a command path. The method may include performing a first delay locking operation on a clock signal to generate a first delay code signal and a second delay code signal, having a first value. The method may include performing a second delay locking operation on the clock signal to update the first delay code signal to a second value, and setting the first delay code signal based on the updated first delay code signal and the delay control signal. The method may include setting a delay amount of the clock path based on the second delay code signal, and setting a delay amount of the command path based on the first delay code signal. And the method may include synchronizing an output command signal, outputted from the command path, with a delay clock signal, outputted from the clock path, based on latency information and the latency control signal.

DETAILED DESCRIPTION

Figure 1:
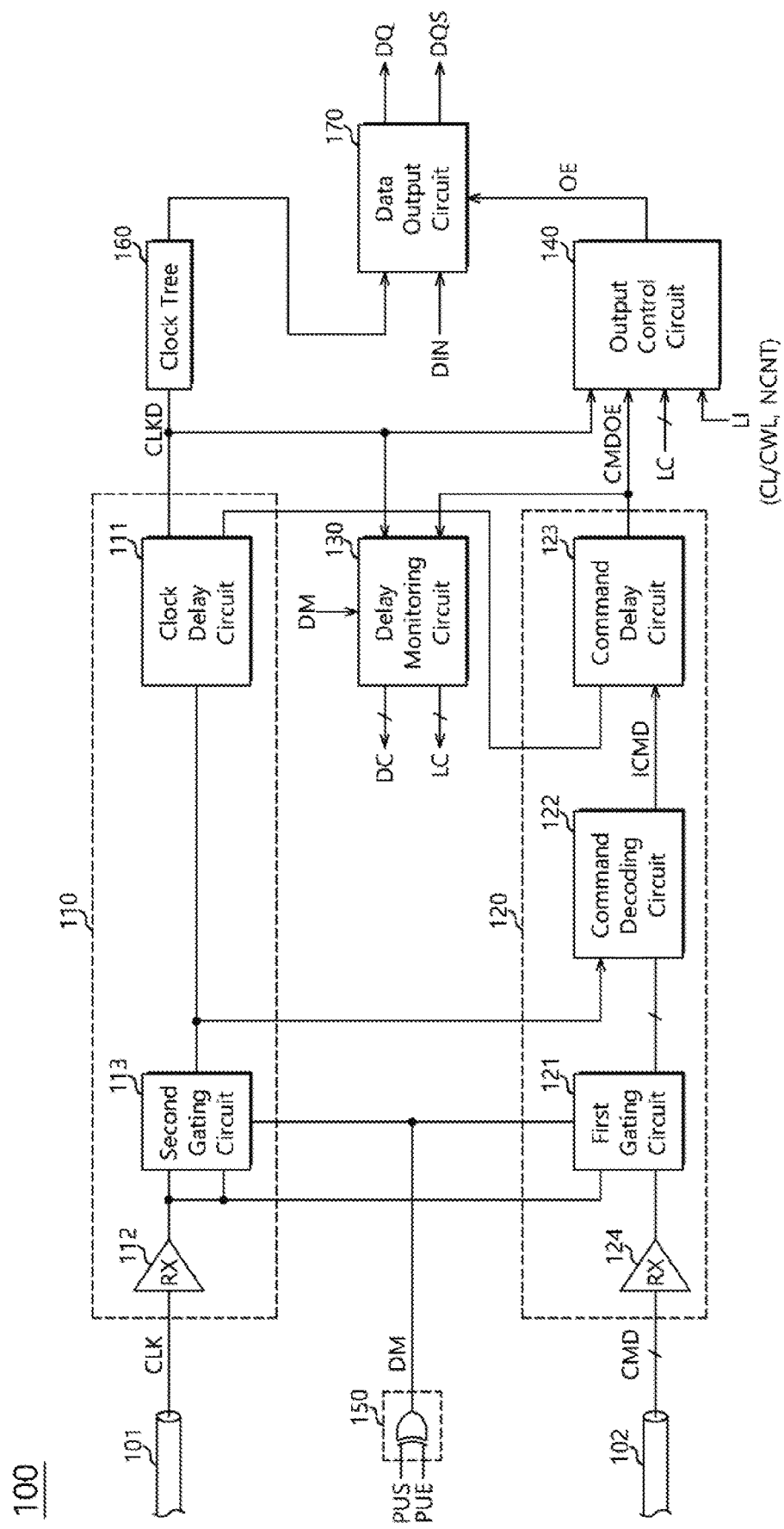
FIG. 1 is a diagram, illustrating a configuration of a semiconductor apparatus, in accordance with an embodiment.

Specific structural or functional descriptions of embodiments based on the concept which are disclosed in the present specification or application are illustrated only to describe the embodiments based on the concept of the present disclosure. The embodiments based on the concept of the present disclosure may be carried out in various forms and the descriptions are not limited to the embodiments described in the present specification or application.

Since various modifications and changes may be applied to the embodiment based on the concept of the present disclosure and the embodiment based on the concept of the present disclosure may have various forms, the specific embodiments will be illustrated in the drawings and described in the present specification or application. However, it should be understood that the embodiment based on the concept of the present disclosure is not construed as limited to a specific disclosure form and includes all changes, equivalents, or substitutes that do not depart from the spirit and technical scope of the present disclosure.

While terms such as "first", "second", and/or the like may be used to describe various components, such components should not be limited to the above-described terms. The above-described terms may be used only to distinguish one component from another component. For example, a first component may be referred to as a second component and similarly, a second component may be referred to as a first component without departing from the scope based on the concept of the present disclosure.

It will be understood that when an element is referred to as being "between" two elements, it can be the only element between the two elements, or one or more intervening elements may also be present.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

FIG. 1 is a diagram illustrating a configuration of a semiconductor apparatus 100, in accordance with an embodiment. In FIG. 1, the semiconductor apparatus 100 may receive a clock signal CLK and a command signal CMD from an external device (not illustrated) and perform various operations. For example, the semiconductor apparatus 100 may be a memory apparatus. The memory apparatus may include a volatile memory and a nonvolatile memory. The volatile memory may include an SRAM (Static RAM), DRAM (Dynamic RAM), and SDRAM (Synchronous DRAM), and the nonvolatile memory may include a ROM (Read Only Memory), PROM (Programmable ROM), EEPROM (Electrically Erasable and Programmable ROM), EPROM (Electrically Programmable ROM), flash memory, PRAM (Phase change RAM), MRAM (Magnetic RAM), RRAM (Resistive RAM), FRAM (Ferroelectric RAM), and the like. The external device of the semiconductor apparatus 100 may be a host device. The host device may be a host device, such as a CPU (Central Processing Unit), a GPU (Graphic Processing Unit), an MMP (Multi-Media Processor), a digital signal processor, an AP (Application Processor), or a memory controller. Furthermore, the external device of the semiconductor apparatus 100 may include a test device and test equipment, which can be coupled to the semiconductor apparatus 100 to test the semiconductor apparatus 100.

The semiconductor apparatus 100 may include a clock path 110 and a command path 120. The clock path 110 may generate a delay clock signal CLKD by delaying the clock signal CLK. The clock path 110 may be coupled to the external device, through a clock bus 101, and receive the clock signal CLK through the clock bus 101. The clock path 110 may generate the delay clock signal CLKD by delaying the clock signal CLK in a synchronous manner. The command path 120 may generate an output command signal CMDOE by delaying the command signal CMD, inputted from the outside of the semiconductor apparatus 100. The command path 120 may be coupled to the external device, through a command bus 102, and may receive the command signal CMD through the command bus 102. The command signal CMD may include different types of command signals. The command path 120 may generate the output command signal CMDOE by decoding the command signal CMD. The command path 120 may generate the output command signal CMDOE by delaying the command signal CMD in an asynchronous manner.

The semiconductor apparatus 100 may generate a monitoring signal DM, and perform a delay monitoring operation based on the monitoring signal DM. The semiconductor apparatus 100 may generate the monitoring signal DM in an initialization interval. The monitoring signal DM may be generated in a power-up operation interval of the semiconductor apparatus 100. When external power is applied to the semiconductor apparatus 100, the semiconductor apparatus 100 may perform a power-up operation. When the voltage level of the external power is stabilized, the semiconductor apparatus 100 may enable the monitoring signal DM. When the power-up operation of the semiconductor apparatus 100 ends, the semiconductor apparatus 100 may disable the monitoring signal DM. The semiconductor apparatus 100 may further include a monitoring signal generation circuit 150. The monitoring signal generation circuit 150 may generate the monitoring signal DM based on a power-up stabilization signal PUS and a power-up end signal PUE. The monitoring signal generation circuit 150 may enable the monitoring signal DM, when the power-up stabilization signal PUS is enabled, and disable the monitoring signal DM, when the power-up end signal PUE is enabled. The monitoring signal generation circuit 150 may include an exclusive OR gate, configured to perform an exclusive OR gating operation on the power-up stabilization signal PUS and the power-up end signal PUE. The exclusive OR gate may receive the power-up stabilization signal PUS and the power-up end signal PUE, and output the monitoring signal DM.

The semiconductor apparatus 100 may monitor the clock path 110 and the command path 120 during an interval in which the monitoring signal DM is enabled. The command path 120 may generate the output command signal CMDOE based on one of the command signal CMD and the clock signal CLK based on the enablement of the monitoring signal DM. When the monitoring signal DM is disabled, the command path 120 may generate the output command signal CMDOE based on the command signal CMD. When the monitoring signal DM is enabled, the command path 120 may generate the output command signal CMDOE based on the clock signal CLK. Therefore, since the delay clock signal CLKD may be generated through the clock path 110 based on the clock signal CLK and the output command signal CMDOE may be generated through the command path 120 based on the clock signal CLK when the monitoring signal DM is enabled, a difference in delay amount between the clock path 110 and the command path 120 can be accurately monitored.

The semiconductor apparatus 100 may include a delay monitoring circuit 130 and an output control circuit 140. The delay monitoring circuit 130 may monitor a difference between the delay amount of the clock path 110 and the delay amount of the command path 120. In order to monitor the difference in the delay amount between the clock path 110 and the command path 120, the delay monitoring circuit 130 may detect a phase difference between the delay clock signal CLKD and the output command signal CMDOE. The delay monitoring circuit 130 may generate a delay control signal DC and a latency control signal LC based on the phase difference between the delay clock signal CLKD and the output command signal CMDOE. The delay control signal DC may be used to change the delay amount of the command path 120. The latency control signal LC may be used in the output control circuit 140, which will be described below. The delay monitoring circuit 130 may receive the monitoring signal DM. When the monitoring signal DM is enabled, the delay monitoring circuit 130 may perform the delay monitoring operation.

The delay monitoring circuit 130 may count the phase difference between the delay clock signal CLKD and the output command signal CMDOE, based on the delay clock signal CLKD, and generate the latency control signal LC based on the counting result. The latency control signal LC may have information on the phase differences, which corresponds to integer multiples of the period of the delay clock signal CLKD, among the phase differences between the delay clock signal CLKD and the output command signal CMDOE. The delay monitoring circuit 130 may generate the delay control signal DC by converting a phase difference into a digital code, the phase difference being smaller than one period of the delay clock signal CLKD, among the phase differences between the delay clock signal CLKD and the output command signal CMDOE.

The output control circuit 140 may synchronize an output of the clock path 110 with an output of the command path 120. The output control circuit 140 may generate an output enable signal OE by synchronizing the output command signal CMDOE with the delay clock signal CLKD. The output control circuit 140 may synchronize the output command signal CMDOE, delayed in the asynchronous manner, with the delay clock signal CLKD delayed in the synchronous manner, thereby converting the domain of the output command signal CMDOE into the domain of the delay clock signal CLKD. The output control circuit 140 may generate the output enable signal OE, delayed in the synchronous manner, by converting the domain of the output command signal CMDOE. The output control circuit 140 may receive the latency control signal LC. The output control circuit 140 may synchronize the output command signal CMDOE with the delay clock signal CLKD based on the latency control signal LC. The latency control signal LC may decide the time at which the output command signal CMDOE is delayed in synchronization with the delay clock signal CLKD. The output control circuit 140 may further receive latency information LI. The latency information may include an N count signal NCNT and one or more of the column address strobe latency CL and the column address strobe write latency CWL. The column address strobe latency CL and the column address strobe write latency CWL may indicate information defining a delay time required before the semiconductor apparatus 100 actually performs an operation, corresponding to the command signal CMD, and outputs data, after receiving the command signal CMD. The N counting signal NCNT will be described below. The output control circuit 140 may generate the output enable signal OE by subtracting the latency control signal LC from the latency information LI, and delaying the output command signal CMDOE during a time, corresponding to the subtraction result.

The clock path 110 may include a clock delay circuit 111. The clock delay circuit 111 may perform a delay locking operation on the clock signal CLK. The clock delay circuit 111 may generate the delay clock signal CLKD by delaying the clock signal CLK based on a delay amount set by the delay locking operation. The clock delay circuit 111 may include a delay locked loop circuit. The delay locked loop circuit may perform a delay locking operation on the clock signal CLK. The clock path 110 may further include a clock receiver 112. The clock receiver 112 may be coupled to the clock bus 101, and receive the clock signal CLK transferred through the clock bus 101. The clock receiver 112 may provide the received clock signal to the clock delay circuit 111.

The command path 120 may include a first gating circuit 121, a command decoding circuit 122, and a command delay circuit 123. The first gating circuit 121 may receive the monitoring signal DM, the command signal CMD, and the clock signal CLK, and output one of the command signal CMD and the clock signal CLK based on the monitoring signal DM. When the monitoring signal DM is disabled, the first gating circuit 121 may output the command signal CMD. When the monitoring signal DM is enabled, the first gating circuit 121 may output the clock signal CLK. The command signal CMD may include a plurality of command signals. When the monitoring signal DM is disabled, the first gating circuit 121 may output the plurality of command signals. When the monitoring signal DM is enabled, the first gating circuit 121 may replace one or more of the plurality of command signals with the clock signal CLK and output the clock signal CLK. The first gating circuit 121 may clamp the other command signals to a specific logic level, and output the command signals with the clamped logic level.

The command decoding circuit 122 may receive the output of the first gating circuit 121. The command decoding circuit 122 may generate an internal command signal ICMD, by decoding the signal outputted, from the first gating circuit 121. The command decoding circuit 122 may generate the internal command signal ICMD by latching the signal, outputted from the first gating circuit 121, based on the clock signal CLK, and decoding the latched signal.

The command delay circuit 123 may be coupled to the command decoding circuit 122, and receive the internal command signal ICMD, outputted from the command decoding circuit 122. The command delay circuit 123 may generate the output command signal CMDOE by delaying the internal command signal ICMD. The command delay circuit 123 may be coupled to the clock delay circuit 111. The command delay circuit 123 may generate the output command signal CMDOE, by delaying the internal command signal ICMD, based on a delay amount, set through a delay locking operation of the clock delay circuit 111. The delay amount of the command delay circuit 123 may be changed based on the delay control signal DC. The delay amount of the command delay circuit 123 may be set through the delay locking operation and then additionally set based on the delay control signal DC.

The command path 120 may further include a command receiver 124. The command receiver 124 may be coupled to the command bus 102 and may receive the command signal CMD transferred through the command bus 102. The command receiver 124 may provide the received command signal to the first gating circuit 121. The command receiver 124 may include a plurality of receivers to receive the plurality of command signals.

The clock path 110 may further include a second gating circuit 113. The second gating circuit 113 may receive the monitoring signal DM and output the clock signal CLK. The second gating circuit 113 may be implemented as a circuit, having the same load as the first gating circuit 121. The clock path 110 may additionally include the second gating circuit 113, corresponding to the first gating circuit 121 in order to have a delay environment, corresponding to the delay environment of the command path 120.

The semiconductor apparatus 100 may further include a clock tree 160 and a data output circuit 170. The clock tree 160 may delay the delay clock signal CLKD, and output the delayed clock signal. The data output circuit 170 may generate data DQ and a data strobe signal DQS based on the output enable signal OE, internal data DIN, and the delayed clock signal. For example, whenever the output enable signal OE is enabled, the data output circuit 170 may generate the data DQ from the internal data DIN, and generate the data strobe signal DQS from the delayed clock signal, outputted from the clock tree 160. The data DQ and the data strobe signal DQS may be outputted to the outside of the semiconductor apparatus 100.

Figure 2:
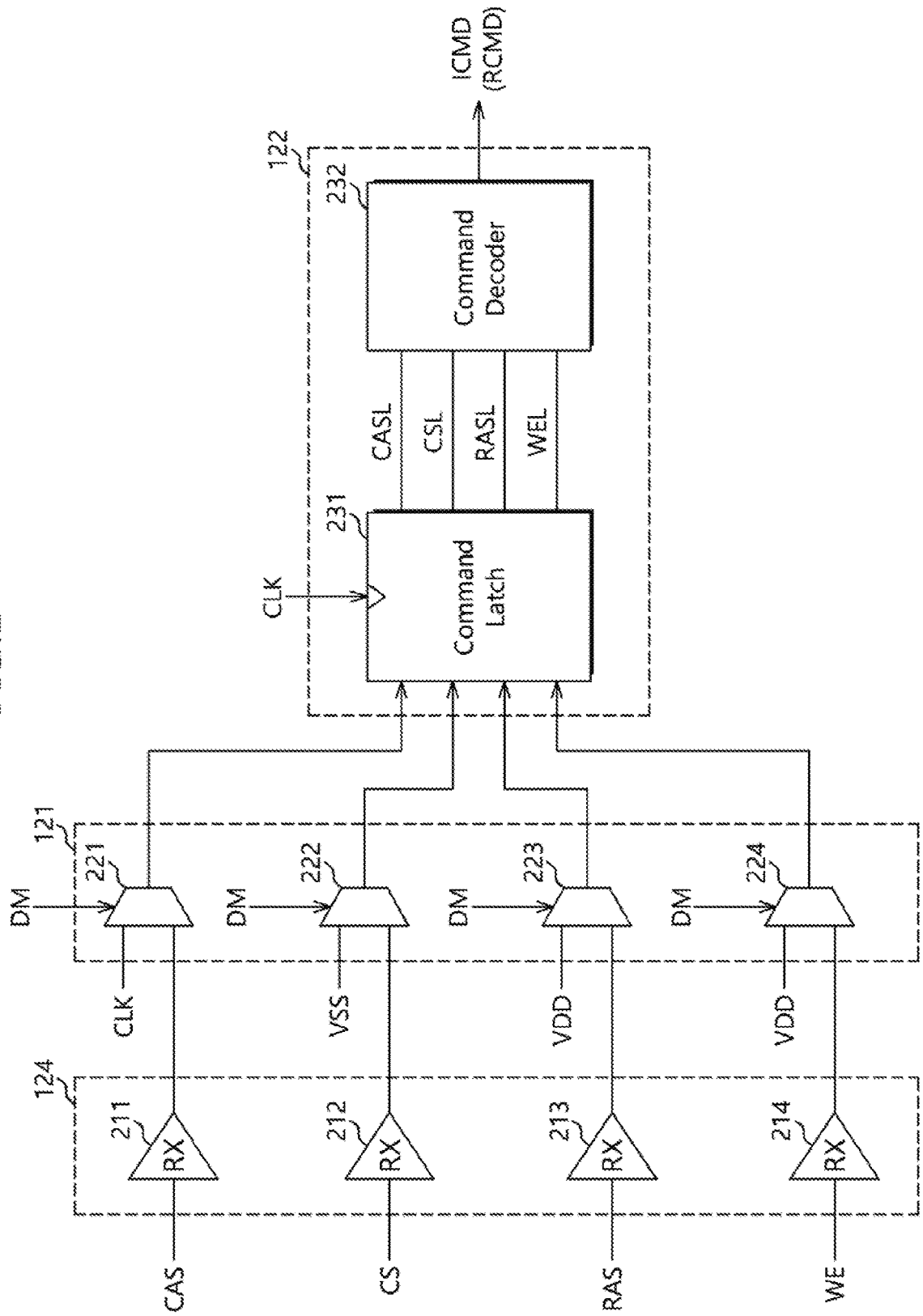
FIG. 2 is a diagram, illustrating configurations of a command receiver, a first gating circuit and a command decoding circuit, which are illustrated in FIG. 1.

FIG. 2 is a diagram, illustrating configurations of the command receiver 124, the first gating circuit 121, and the command decoding circuit 122 in the command path 120. The command receiver 124 may include first to fourth receivers 211 to 214. FIG. 2 illustrates that the semiconductor apparatus 100 receives four command signals. However, the number of command signals is not limited thereto. In other words, the semiconductor apparatus 100 may receive more or less than four command signals. In an embodiment, the command bus 102, illustrated in FIG. 1, may include four signal transfer lines, and one command signal may be transferred through one signal transfer line. The four command signals may be transferred through the four signal transfer lines, respectively. The first receiver 211 may receive a column address strobe signal CAS. The second receiver 212 may receive a chip selection signal CS. The third receiver 213 may receive a row address strobe signal RAS. The fourth receiver 214 may receive a write enable signal WE.

The first gating circuit 121 may include a first multiplexer 221, a second multiplexer 222, a third multiplexer 223 and a fourth multiplexer 224. The first to fourth multiplexers 221 to 224 may receive the same monitoring signal DM. The first multiplexer 221 may receive the clock signal CLK and the column address strobe signal CAS, received through the first receiver 211, and output one of the column address strobe signal CAS and the clock signal CLK based on the monitoring signal DM. When the monitoring signal DM is disabled, the first multiplexer 221 may output the column address strobe signal CAS. When the monitoring signal DM is enabled, the first multiplexer 221 may output the clock signal CLK. When the monitoring signal DM is enabled, the first multiplexer 221 may output the clock signal CLK as the column address strobe signal CAS. The second multiplexer 222 may receive a first supply voltage VSS and the chip selection signal CS, received through the second receiver 212, and output one of the chip selection signal CS and the first supply voltage VSS based on the monitoring signal DM. When the monitoring signal DM is disabled, the second multiplexer 222 may output the chip selection signal CS. When the monitoring signal DM is enabled, the second multiplexer 222 may output the first supply voltage VSS. When the monitoring signal DM is enabled, the first supply voltage VSS may be a ground voltage, and the second multiplexer 222 may clamp the chip selection signal CS to a logic low level.

The third multiplexer 223 may receive a second supply voltage VDD and the row address strobe signal RAS, received through the third receiver 213, and output one of the row address strobe signal RAS and the second supply voltage VDD based on the monitoring signal DM. When the monitoring signal DM is disabled, the third multiplexer 223 may output the row address strobe signal RAS. When the monitoring signal DM is enabled, the third multiplexer 223 may output the second supply voltage VDD. When the monitoring signal DM is enabled, the second supply voltage VDD may have a higher voltage level than the first supply voltage VSS, and the third multiplexer 223 may clamp the row address strobe signal RAS to a logic low level. The fourth multiplexer 224 may receive the second supply voltage VDD and the write enable signal WE, received through the fourth receiver 214, and output one of the write enable signal WE and the second supply voltage VDD based on the monitoring signal DM. When the monitoring signal DM is disabled, the fourth multiplexer 224 may output the write enable signal WE. When the monitoring signal DM is enabled, the fourth multiplexer 224 may output the second supply voltage VDD. When the monitoring signal DM is enabled, the fourth multiplexer 224 may clamp the write enable signal WE to a logic low level.

The second gating circuit 113, illustrated in FIG. 1, may have the same structure as any one of the first to fourth multiplexers 221 to 224. The second gating circuit 113 may receive the clock signal CLK through two input terminals thereof, and output one of the clock signals CLK, inputted to the two input terminals based on the monitoring signal DM. The second gating circuit 113 may be provided to compensate for the delay time caused by the first gating circuit 121.

The command decoding circuit 122 may include a command latch 231 and a command decoder 232. The command latch 231 may receive the clock signal CLK and the signals, outputted from the first gating circuit 121. The command latch 231 may latch the signals, outputted from the first gating circuit 121, in synchronization with the clock signal CLK. For example, the command latch 231 may latch the logic levels of the signals, outputted from the first gating circuit 121 in synchronization with a rising edge of the clock signal CLK. The command latch 231 may latch the output of the first multiplexer 221, in synchronization with the clock signal CLK, and output the latched signal as a latched column address strobe signal CASL. The command latch 231 may latch the output of the second multiplexer 222, in synchronization with the clock signal CLK, and output the latched signal as a latched chip selection signal CSL. The command latch 231 may latch the output of the third multiplexer 223, in synchronization with the clock signal CLK, and output the latched signal as a latched row address strobe signal RASL. The command latch 231 may latch the output of the fourth multiplexer 224, in synchronization with the clock signal CLK and output the latched signal as a latched write enable signal WEL. The command decoder 232 may receive the latched column address strobe signal CASL, the latched chip selection signal CSL, the latched row address strobe signal RASL and the latched write enable signal WEL from the command latch 231, and generate the internal command signal ICMD by decoding the signals. The command decoder 232 may generate various internal command signals ICMD depending on the logic levels of the signals latched by the command latch 231. The internal command signal ICMD may include one or more of an active signal, a precharge signal, a write signal, a read signal and a refresh signal, for example.

When the monitoring signal DM is enabled, the first gating circuit 121 may output the clock signal CLK instead of the column address strobe signal CAS, clamp the chip selection signal CS to a logic low level, and clamp the row address strobe signal RAS and the write enable signal WE to a logic high level. The command latch 231 may latch the signals outputted from the first gating circuit 121 and provide the latched signals to the command decoder 232. Since the latched chip selection signal CSL is at a logic low level and the latched row address strobe signal RASL and the latched write enable signal WEL are at a logic high level, the command decoder 232 may generate the internal command signal ICMD based on a change in logic level of the latched column address strobe signal CASL. Since the latched column address strobe signal CASL corresponds to the clock signal CLK, the command decoder 232 may periodically enable a read signal RCMD, for example, as the internal command signal ICMD. The read signal RCMD may be enabled in substantially the same period as the clock signal CLK.

Figure 3:
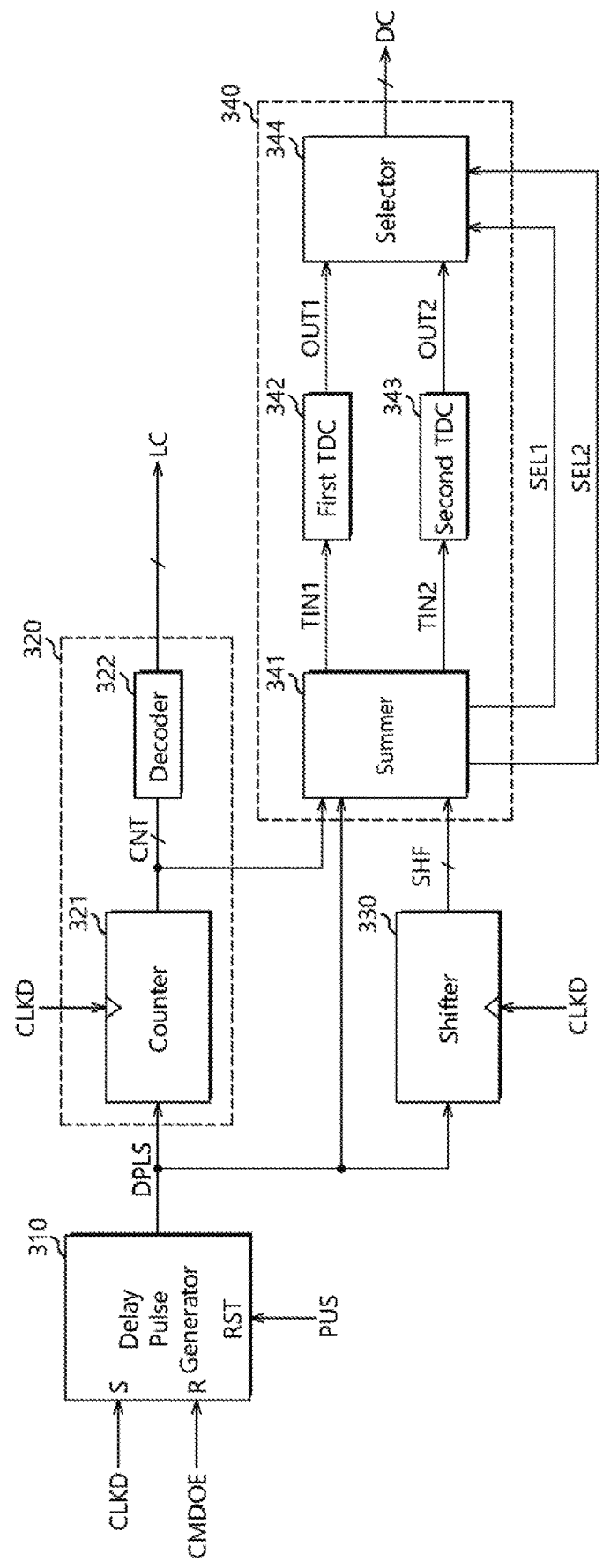
FIG. 3 is a diagram, illustrating a configuration of a delay monitoring circuit, illustrated in FIG. 1.

FIG. 3 is a diagram, illustrating the configuration of the delay monitoring circuit 130 illustrated in FIG. 1. In FIG. 3, the delay monitoring circuit 130 may include a delay pulse generator 310, a counting circuit 320, a shifter 330, and a time-to-digital conversion circuit 340. The delay pulse generator 310 may receive the delay clock signal CLKD and the output command signal CMDOE. The delay pulse generator 310 may generate a delay pulse signal DPLS, corresponding to a phase difference between the delay clock signal CLKD and the delay command signal CMDOE. The delay pulse signal DPLS may have a pulse width, corresponding to the phase difference between the delay clock signal CLKD and the delay command signal CMDOE. The delay pulse generator 310 may include an SR latch. The delay pulse generator 310 may receive the delay clock signal CLKD, through a set terminal S, and receive the output command signal CMDOE, through a reset terminal R. Therefore, the delay pulse generator 310 may enable the delay pulse signal DPLS, when the delay clock signal CLKD is enabled, and disable the delay pulse signal DPLS, when the output command signal CMDOE is enabled. The delay pulse generator 310 may receive the power-up stabilization signal PUS through its reset terminal RST. The delay pulse generator 310 may be reset based on the power-up stabilization signal PUS, and reset the delay pulse signal DPLS to, for example, a logic low level.

The counting circuit 320 may receive the delay pulse signal DPLS and the delay clock signal CLKD. The counting circuit 320 may generate the latency control signal LC by counting the delay pulse signal DPLS based on the delay clock signal CLKD. The counting circuit 320 may count the delay pulse signal DPLS in synchronization with rising edges of the delay clock signal CLKD. Therefore, the counting circuit 320 may count the pulse width of the delay pulse signal DPLS as an integer multiple of the period of the delay clock signal CLKD. For example, when the pulse width of the delay pulse signal DPLS corresponds to between two periods and three periods of the delay clock signal CLKD, the counting circuit 320 may count three, and generate the latency control signal LC corresponding to three. The counting circuit 320 may include a counter 321 and a decoder 322. The counter 321 may count the delay pulse signal DPLS, based on the delay clock signal CLKD, and output a plurality of counting signals CNT. For example, when the delay pulse signal DPLS has a logic high level at a rising edge of the delay clock signal CLKD, a pulse of the counting signal CND may be generated. When the delay pulse signal DPLS has a logic low level at a rising edge of the delay clock signal CLKD, a pulse of the counting signal CNT might not be generated. The counting signal CNT may include a plurality of counting signals. For example, the counter 321 may generate a first pulse of the counting signal CNT when the delay pulse signal DPLS has a logic high level at a first rising edge of the delay clock signal CLKD, and generate a second pulse of the counting signal CNT when the delay pulse signal DPLS has a logic high level at a second rising edge of the delay clock signal CLKD. The decoder 322 may receive the counting signal CNT and generate the latency control signal LC. The latency control signal LC may be a code signal having n bits, where n is an integer equal to or greater than 2. For example, when the counting result of the counter 321 is three, and the number of bits, included in the latency control signal, is two, the decoder 322 may generate a latency control signal LC, having a logic level of 1 or 0 based on three pulses of the counting signal CNT.

The shifter 330 may receive the delay pulse signal DPLS and the delay clock signal CLKD. The shifter 330 may shift the delay pulse signal DPLS in synchronization with the delay clock signal CLKD. The shifter 330 may generate a plurality of shifted signals SHF by shifting the delay pulse signal DPLS at the respective rising edges of the delay clock signal CLKD. The respective shifted signals SHF may sequentially have a phase difference, corresponding to one period of the delay clock signal CLKD.

The time-to-digital conversion circuit 340 may receive the delay pulse signal DPLS, the counting signals CNT and the shifted signals SHF. The time-to-digital conversion circuit 340 may generate the delay control signal DC, corresponding to a pulse width smaller than one period of the delay clock signal CLKD, among the pulse widths of the delay pulse signal DPLS, based on the delay pulse signal DPLS, the counting signals CNT and the shifted signals SHF.

The time-to-digital conversion circuit 340 may include a summer 341, a first time-to-digital converter 342, a second time-to-digital converter 343, and a selector 344. The summer 341 may receive the delay pulse signal DPLS, the counting signals CNT, and the shifted signals SHF, and generate a first time input signal TIN1, a second time input signal INT2, a first selection signal SEL1, and a second selection signal SEL2. The summer 341 may generate the first time input signal TIN1 based on the delay pulse signal DPLS, the odd-numbered counting signals CNT, and the odd-numbered shifted signals SHF. The summer 341 may generate the second time input signal TIN2 based on the delay pulse signal DPLS, the even-numbered counting signals CNT, and the even-numbered shifted signals SHF. The summer 341 may generate the first selection signal SEL1 based on the odd-numbered counting signals CNT. The summer 341 may generate the second selection signal SEL2 based on the even-numbered counting signals CNT.

The first time-to-digital converter 342 may receive the first time input signal TIN1. The first time-to-digital converter 342 may quantize the first time input signal TIN1, and generate a first digital code signal OUT1, corresponding to the first time input signal TIN1. The second time-to-digital converter 343 may receive the second time input signal TIN2. The second time-to-digital converter 343 may quantize the second time input signal TIN2, and generate a second digital code signal OUT2, corresponding to the second time input signal TIN2.

The selector 344 may receive the first digital code signal OUT1, the second digital code signal OUT2, the first selection signal SEL1, and the second selection signal SEL2. The selector 344 may output one of the first and second digital code signals OUT1 and OUT2 as the delay control signal DC based on the first and second selection signals SEL1 and SEL2. When the first selection signal SEL1 is enabled, the selector 344 may output the first digital code signal OUT1 as the delay control signal DC. On the other hand, when the second selection signal SEL2 is enabled, the selector 344 may output the second digital code signal OUT2 as the delay control signal DC.

Figure 4:
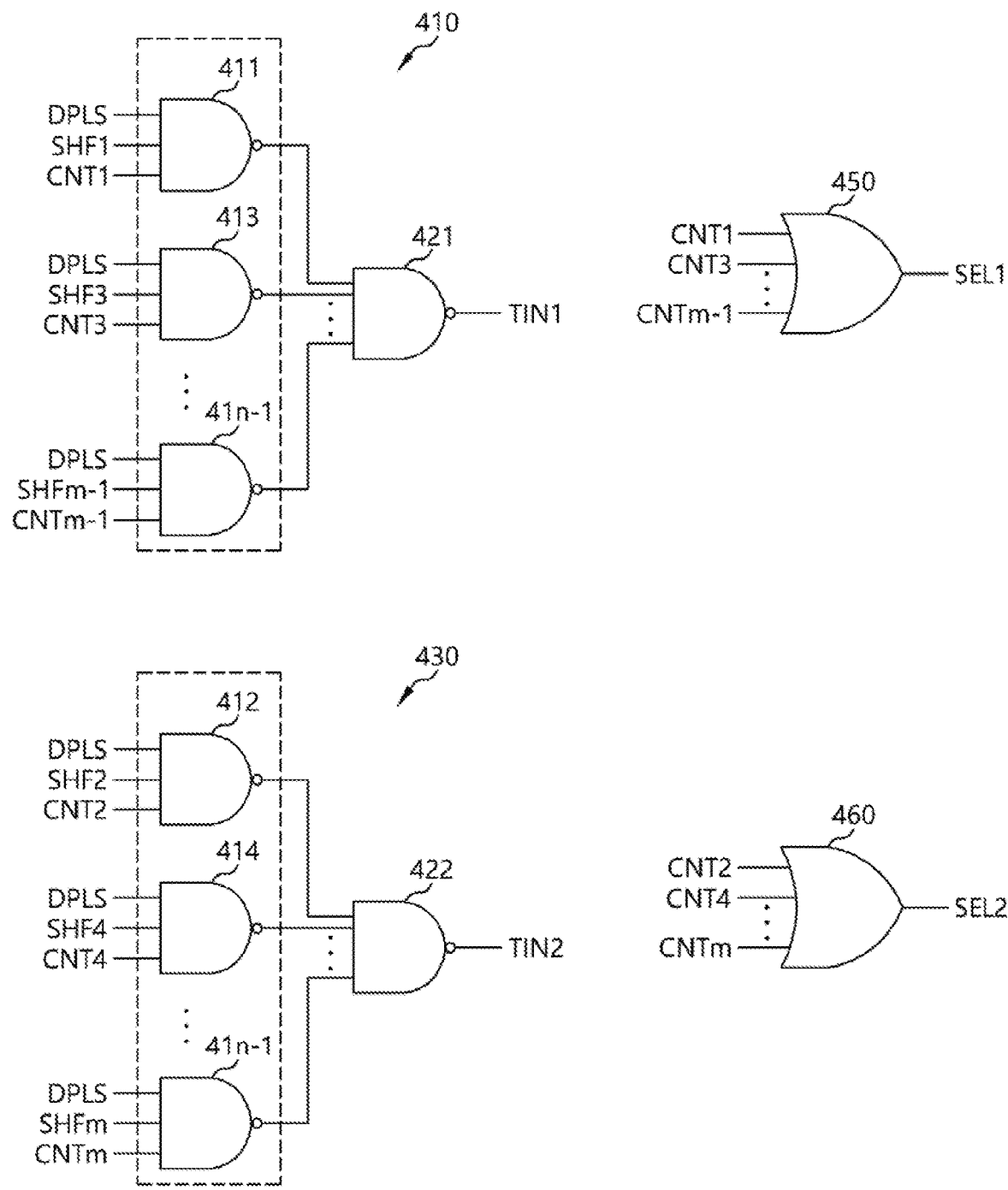
FIG. 4 is a diagram, illustrating a configuration of a summer illustrated in FIG. 3.

FIG. 4 is a diagram, illustrating the configuration of the summer 341, illustrated in FIG. 3. In FIG. 4, the summer 341 may include a first time input signal generator 410, a second time input signal generator 430, a first selection signal generator 450, and a second selection signal generator 460. Each of the first and second time input signal generators 410 and 430 may include a plurality of input NAND gates. The number of the input NAND gates may be set to a value, corresponding to at least the number of the counting signals CNT and the number of the shifted signals SHF. The first time input signal generator 410 may include a first input NAND gate 411, a third input NAND gate 413, ..., an $(m-1)^{th}$ input NAND gate 41$m$-1, and a first output NAND gate 421, where m is a random integer equal to or greater than 6. The first input NAND gate 411 may receive the delay pulse signal DPLS, a first shifted signal SHF1 and a first counting signal CNT1. The third input NAND gate 413 may receive the delay pulse signal DPLS, a third shifted signal SHF3 and a third counting signal CNT3. The $(m-1)^{th}$ input NAND gate 41$m$-1 may receive the delay pulse signal DPLS, an $(m-1)^{th}$ shifted signal SHFm-1, and an $(m-1)^{th}$ counting signal CNTm-1. The first output NAND gate 421 may receive outputs of the first input NAND gate 411, the third input NAND gate 413, ..., and the $(m-1)^{th}$ input NAND gate 41$m$-1, and output the first time input signal TIN1.

The second time input signal generator 430 may include a second input NAND gate 412, a fourth input NAND gate 414, ..., an $m^{th}$ input NAND gate 41$m$, and a second output NAND gate 422. The second input NAND gate 412 may receive the delay pulse signal DPLS, a second shifted signal SHF2, and a second counting signal CNT2. The fourth input NAND gate 414 may receive the delay pulse signal DPLS, a fourth shifted signal SHF4, and a fourth counting signal CNT4. The $m^{th}$ input NAND gate 41$m$ may receive the delay pulse signal DPLS, an $m^{th}$ shifted signal SHFm, and an $m^{th}$ counting signal CNTm. The second output NAND gate 422 may receive the outputs of the second input NAND gate 412, the fourth input NAND gate 414, ..., and the $m^{th}$ input NAND gate 41$m$, and output the second time input signal TIN2.

The first selection signal generator 450 may include an OR gate. The first selection signal generator 450 may receive the odd-numbered counting signals and generate the first selection signal SEL1. The first selection signal generator 450 may receive the first counting signal CNT1, the third counting signal CNT3, ..., and the $(m-1)^{th}$ counting signal CNTm-1, and generate the first selection signal SEL1. The second selection signal generator 460 may include an OR gate. The second selection signal generator 460 may receive the even-numbered counting signals and generate the second selection signal SEL2. The second selection signal generator 460 may receive the second counting signal CNT2, the fourth counting signal CNT4, ..., and the $m^{th}$ counting signal CNTm, and generate the second selection signal SEL2.

Figure 5:
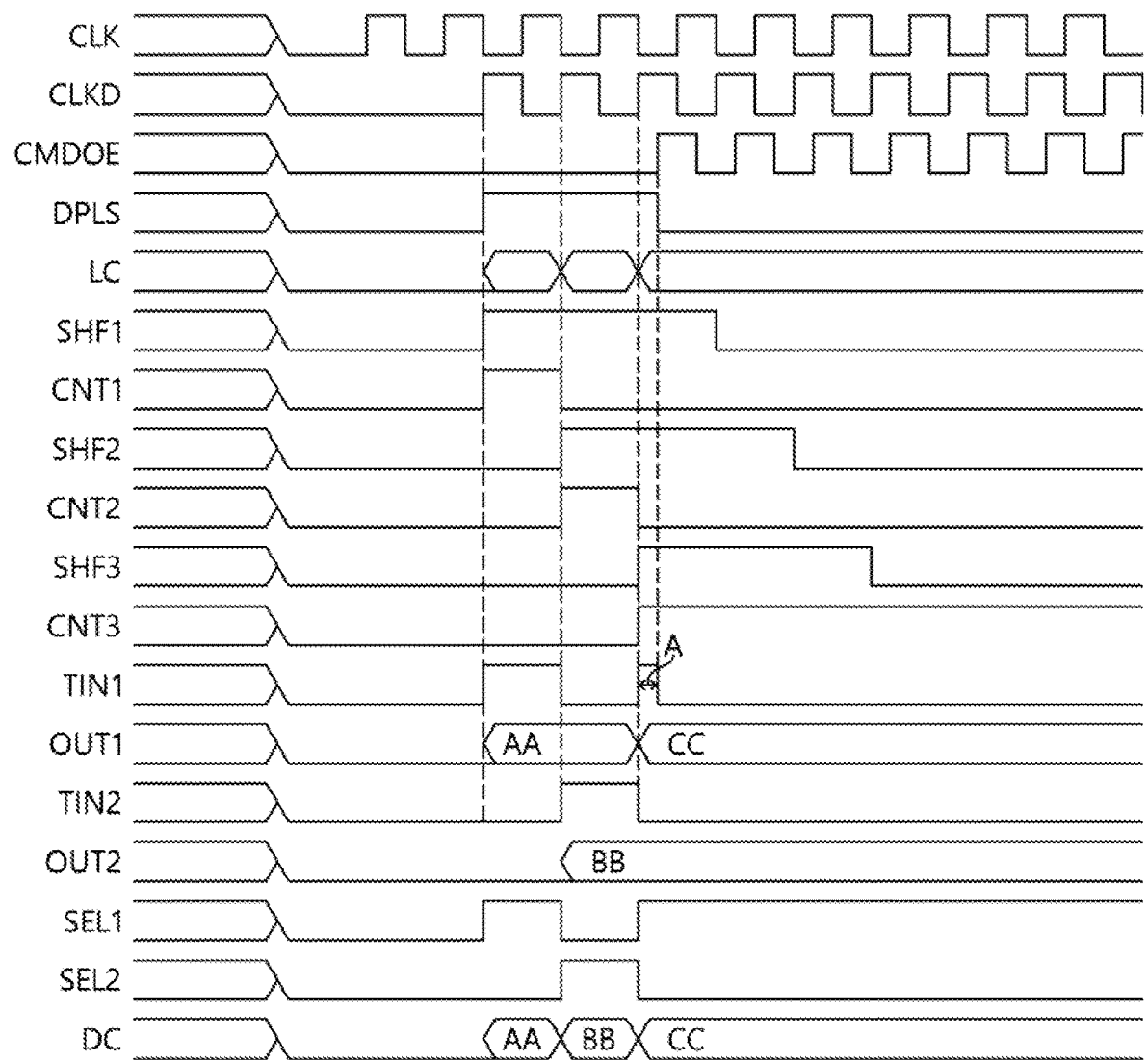
FIG. 5 is a timing diagram, illustrating an operation of the delay monitoring circuit, illustrated in FIGS. 1 and 3.

FIG. 5 is a timing diagram, illustrating an operation of the delay monitoring circuit, illustrated in FIGS. 1 and 3. Referring to FIGS. 1, 3, 4, and 5, the operation of the delay monitoring circuit 130 will be described as follows. The command path 120 may have a larger delay amount than that of the clock path 110, due to the command decoding circuit 122. Therefore, the delay clock signal CLKD may be enabled before the output command signal CMDOE. The delay pulse generator 310 may generate the delay pulse signal DPLS, having a pulse width, corresponding to an interval from a point of time that the delay clock signal CLKD is enabled to a point of time that the output command signal CMDOE is enabled. FIG. 5 illustrates the case in which the difference in delay amount between the clock path 110 and the command path 120, i.e. the pulse width of the delay pulse signal DPLS, ranges from two times to three times the period of the delay clock signal CLKD.

The counting circuit 320 may count the delay pulse signal DPLS based on the delay clock signal CLKD. Since the pulse width of the delay pulse signal DPLS ranges from two times to three times the period of the delay clock signal CLKD, the counting circuit 320 may generate three counting signals CNT1 to CNT3 by performing three counting operations. The counting circuit 320 may change the value of the latency control signal LC based on the three counting signals. The shifter 330 may generate the plurality of shifted signal by shifting the delay pulse signal DPLS in synchronization with the delay clock signal CLKD. The first shifted signal SHF1 may have the same phase as the delay clock signal CLKD. The second shifted signal SHF2 may have a phase that lags behind the first shifted signal SHF1 by one period of the delay clock signal CLKD. The third shifted signal SHF3 may have a phase that lags behind the second shifted signal SHF2 by one period of the delay clock signal CLKD.

The first time input signal generator 410 of the summer 341 may generate the first time input signal TIN1 having a pulse width corresponding to one period of the delay clock signal CLKD based on the delay pulse signal DPLS, the first shifted signal SHF1 and the first counting signal CNT1. The first selection signal generator 450 of the summer 341 may generate the first selection signal SEL1 based on the first counting signal CNT1. The first time-to-digital converter 342 may receive the first time input signal TIN1, and output the first digital code signal OUT1 having information AA corresponding to one period of the delay clock signal CLKD. The selector 344 may output the first digital code signal OUT1 as the delay control signal DC based on the first selection signal SEL1.

The second time input signal generator 430 of the summer 341 may generate the second time input signal TIN2 having a pulse width corresponding to one period of the delay clock signal CLKD based on the delay pulse signal DPLS, the second shifted signal SHF2 and the second counting signal CNT2. The second selection signal generator 460 of the summer 341 may generate the second selection signal SEL2 based on the second counting signal CNT2. The second time-to-digital converter 343 may receive the second time input signal TIN2, and output the second digital code signal OUT2 having information BB corresponding to one period of the delay clock signal CLKD. The selector 344 may output the second digital code signal OUT2 as the delay control signal DC based on the second selection signal SEL2.

The first time input signal generator 410 of the summer 341 may generate the first time input signal TIN1 based on the delay pulse signal DPLS, the third shifted signal SHF3 and the third counting signal CNT3. At this time, the first time input signal TIN1 may have a pulse width corresponding to a pulse width smaller than one period of the delay clock signal CLKD among the pulse widths of the delay pulse signal DPLS. The first time input signal TIN1 may have a pulse width corresponding to A in FIG. 5. The first selection signal generator 450 of the summer 341 may generate the first selection signal SEL1 based on the third counting signal CNT3. The first time-to-digital converter 342 may receive the first time input signal TIN1, and output the first digital code signal OUT1 having information CC corresponding to the pulse width A. The selector 344 may output the first digital code signal OUT1 as the delay control signal DC based on the first selection signal SEL1. Since the counting circuit 320 does not perform an additional counting operation when the delay pulse signal DPLS is disabled, the delay control signal DC may be set to have the information CC corresponding to the pulse width A.

Figure 6:
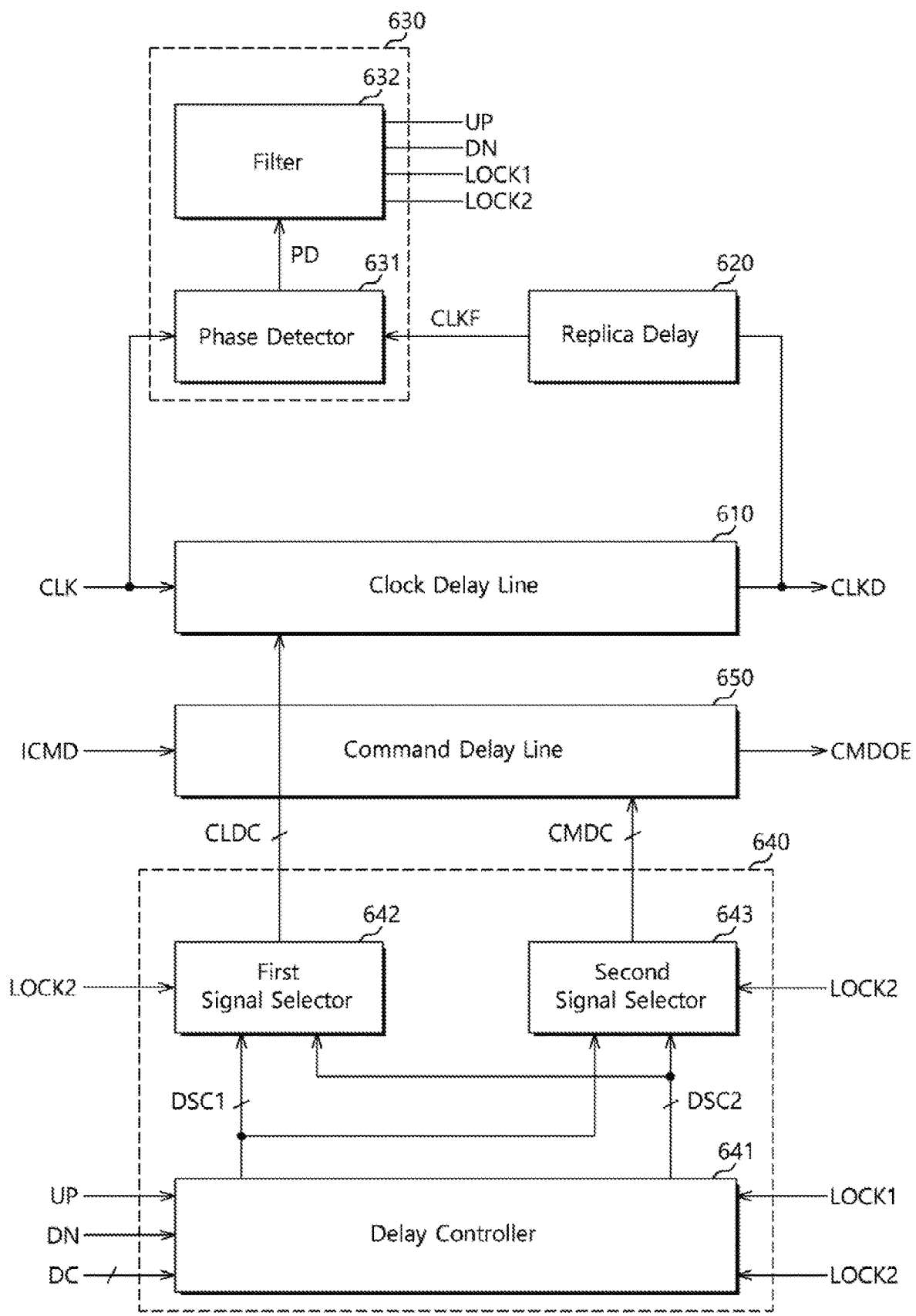
FIG. 6 is a diagram, illustrating configurations of a clock delay circuit and a command delay circuit, which are illustrated in FIG. 1.

FIG. 6 is a diagram, illustrating the configurations of the clock delay circuit 111 and the command delay circuit 123, which are illustrated in FIG. 1. The clock delay circuit 111 may include a delay locked loop circuit. The clock delay circuit 111 may include a clock delay line 610, a replica delay 620, a phase detection circuit 630, and a delay line control circuit 640. The command delay circuit 123 may include a command delay line 650. The clock delay line 610 may generate the delay clock signal CLKD by delaying the clock signal CLK. The clock delay line 610 may receive a clock delay setting signal CLDC, and have a delay amount that is set based on the clock delay setting signal CLDC. The replica delay 620 may receive the delay clock signal CLKD and generate a feedback clock signal CLKF by delaying the delay clock signal CLKD by a modeled delay amount. The modeled delay amount may be randomly set. For example, the modeled delay amount may be set by modeling a delay time, required until the clock signal CLK is inputted to the clock delay line 610, from the point of time that the clock signal CLK is inputted from the outside of the semiconductor apparatus.

The phase detection circuit 630 may generate a phase detection signal UP/DN, a first lock signal LOCK1, and a second lock signal LOCK2 by comparing the phases of the clock signal CLK and the feedback clock signal CLKF. The phase detection circuit 630 may generate the phase detection signal UP/DN based on the comparison result between the phases of the clock signal CLK and the feedback clock signal CLKF. The phase detection circuit 630 may generate the first lock signal LOCK1 when the phases of the clock signal CLK and the feedback clock signal CLKF coincide with each other during a first delay locking operation. The phase detection circuit 630 may generate the second lock signal LOCK2 when the phases of the clock signal CLK and the feedback clock signal CLKF coincide with each other during a second delay locking operation.

The phase detection circuit 630 may include a phase detector 631 and a filter 632. The phase detector 631 may generate a detection signal PD by comparing the phases of the clock signal CLK and the feedback clock signal CLKF. The filter 632 may receive the detection signal PD, and generate the phase detection signal UP/DN, the first lock signal LOCK1, and the second lock signal LOCK2, based on the detection signal PD. For example, the filter 632 may include one or more of an average filter and a moving average filter. The phase detection signal UP/DN may include an up signal UP and a down signal DN. The filter 632 may generate the up signal UP and the down signal DN when the detection signals PD, having the same logic level, are consecutively generated or when a difference between the number of times that the detection signal PD, having one logic level, is generated, and the number of times that the detection signal PD, having another logic level, is generated, reaches a threshold value. For example, the up signal UP may serve as a signal for increasing the value of the clock delay setting signal CLDC in order to increase the delay amount of the clock delay line 610, and the down signal DN may serve as a signal for decreasing the value of the clock delay setting signal CLDC in order to decrease the delay amount of the clock delay line 610. The filter 632 may generate the first lock signal LOCK1 and the second lock signal LOCK2 when the detection signals PD, having different logic levels, are alternately generated.

The delay line control circuit 640 may generate the clock delay setting signal CLDC and a command delay setting signal CMDC based on the phase detection signal UP/DN, the delay control signal DC, the first lock signal LOCK1 and the second lock signal LOCK2. The command delay setting signal CMDC may serve as a signal to set the delay amount of the command delay line 650. The command delay line 650 may generate the output command signal CMDOE by delaying the internal command signal ICMD. The delay line control circuit 640 may change the values of the clock delay setting signal CLDC and the command delay setting signal CMDC based on the phase detection signal UP/DN. The delay line control circuit 640 may control the delay locked loop circuit to perform the first delay locking operation and the second delay locking operation. The delay line control circuit 640 may perform the first delay locking operation to set the values of the clock delay setting signal CLDC and the command delay setting signal CMDC and may retain the values of the clock delay setting signal CLDC and the command delay setting signal CMDC based on the first lock signal LOCK1. At this time, the clock delay setting signal CLDC and the command delay setting signal CMDC may be set to a first value.

The delay line control circuit 640 may perform the second delay locking operation when the first delay locking operation is completed. The second delay locking operation may be a harmonic delay locking operation. For example, the delay line control circuit 640 may change the value of the clock delay setting signal CLDC, which is set by the first delay locking operation. The delay line control circuit 640 may increase the value of the clock delay setting signal CLDC in order to further increase the delay amount of the clock delay line 610 by a time, corresponding to one period of the clock signal CLK and/or the delay clock signal CLKD. When the value of the clock delay setting signal CLDC increases, the second delay locking operation may be performed to update the value of the clock delay setting signal CLDC to a new value. The updated value of the clock delay setting signal CLDC may correspond to a second value. When the second lock signal LOCK2 is generated, the second delay locking operation may be completed, and the delay line control circuit 640 may control the clock delay setting signal CLDC to have the first value. The delay line control circuit 640 may subtract the delay control signal DC from the second value, and set the command delay setting signal CMDC to a value, corresponding to the subtraction result.

The delay line control circuit 640 may include a delay controller 641, a first signal selector 642, and a second signal selector 643. The delay controller 641 may receive the up signal UP, the down signal DN, the delay control signal DC, the first lock signal LOCK1, and the second lock signal LOCK2, and generate a first delay code signal DSC1 and a second delay code signal DSC2. The first signal selector 642 may output one of the first and second delay code signals DSC1 and DSC2, as the clock delay setting signal CLDC, based on the second lock signal LOCK2. The second signal selector 643 may output one of the first and second delay code signals DSC1 and DSC2 as the command delay setting signal CMDC based on the second lock signal LOCK2.

Figure 7:
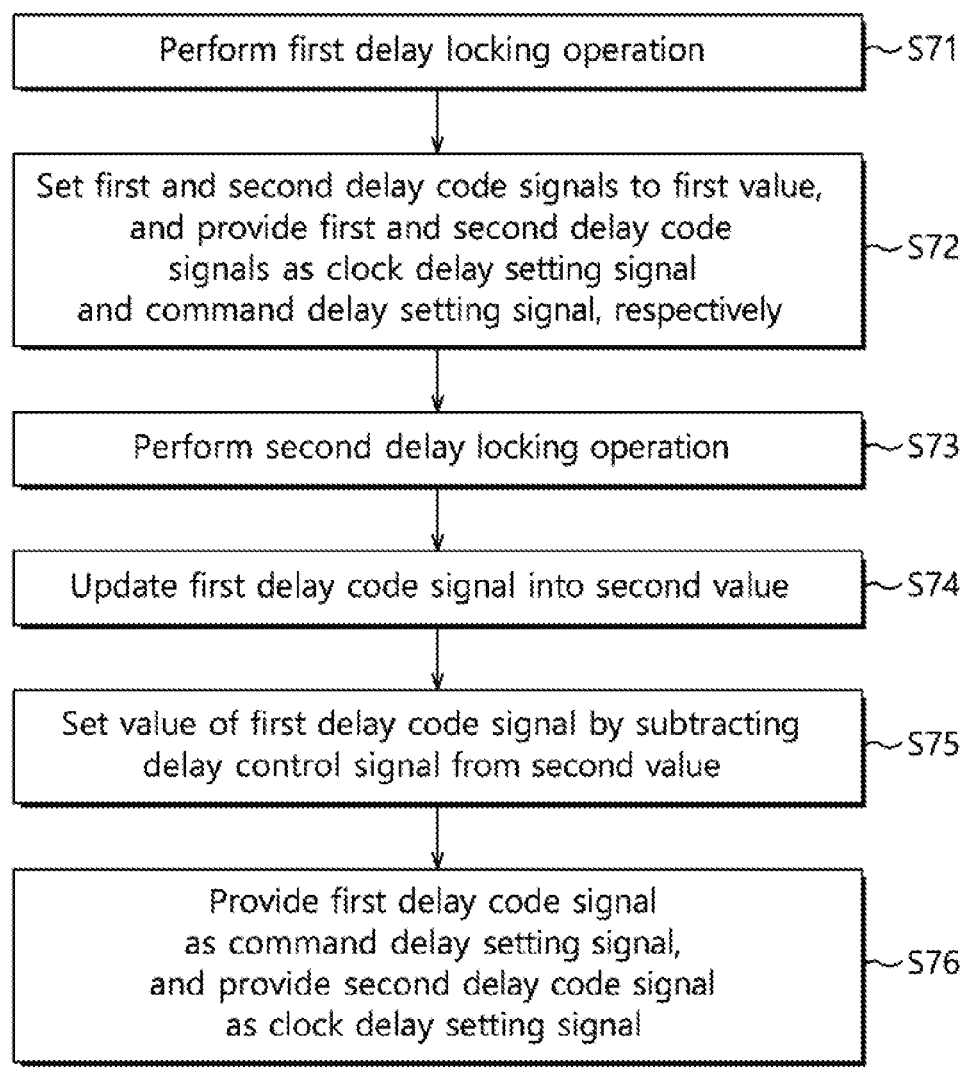
FIG. 7 is a flowchart, illustrating operations of the clock delay circuit and the command delay circuit.
Figure 8:
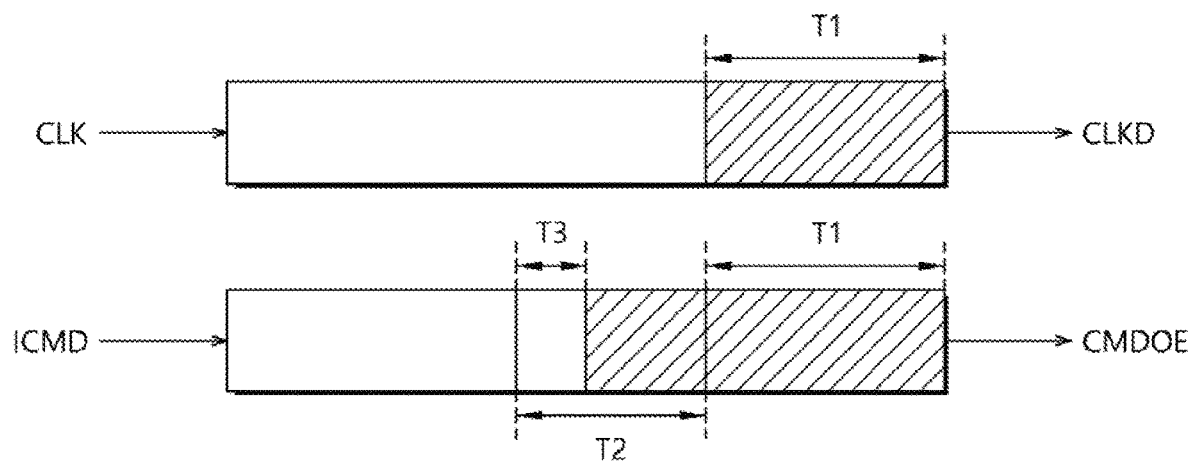
FIG. 8 is a diagram, illustrating delay amounts of the clock delay circuit and the command delay circuit, which are set by the operations of FIG. 7.

FIG. 7 is a flowchart, illustrating the operations of the clock delay circuit 111 and the command delay circuit 123, which are illustrated in FIG. 6, and FIG. 8 is a diagram, illustrating the delay amounts of the clock delay line 610 and the command delay line 650, which are set by the operation of FIG. 7. Referring to FIGS. 6 to 8, the operations of the clock delay circuit 111 and the command delay circuit 123 will be described as follows. When the monitoring signal DM is enabled, the delay monitoring circuit 130, illustrated in FIG. 1, may generate the delay control signal DC and the latency control signal LC based on a phase difference between the delay clock signal CLKD and the output command signal CMDOE. In step S71, the clock delay circuit 111 may perform the first delay locking operation. The replica delay 620 may generate the feedback clock signal CLKF by delaying the delay clock signal CLKD. The phase detection circuit 630 may generate the phase detection signal UP/DN by comparing the phases of the clock signal CLK and the feedback clock signal CLKF. The delay line control circuit 640 may change the values of the first and second delay code signals DSC1 and DSC2 based on the phase detection signal UP/DN. When the phase detection circuit 630 enables the first lock signal LOCK1, the first and second delay code signals DSC1 and DSC2 may retain the changed values in step S72. The first and second delay code signals DSC1 and DSC2 may be set to the first value. Since the second lock signal LOCK2 is not yet generated, the first signal selector 642 may output the first delay code signal DSC1 as the clock delay setting signal CLDC, and the second signal selector 643 may output the second delay code signal DSC2 as the command delay setting signal CMDC. Based on the clock delay setting signal CLDC and the command delay setting signal CMDC which are set to the first value, the delay amounts of the clock delay line 610 and the command delay line 650 may be set to the same delay amount.

When the first delay locking operation is completed, the second delay locking operation may be performed in step S73. The second delay locking operation may be a harmonic delay locking operation. The delay line control circuit 640 may increase the value of the clock delay setting signal CLDC to perform the harmony delay locking operation. The delay line control circuit 640 may update the first delay code signal DSC1 based on the phase detection signal UP/DN generated through the phase detection circuit 630. When the phase detection circuit 630 enables the second lock signal LOCK2, the first delay code signal DSC1 may retain the changed value in step S74. The first delay code signal DSC1 may be set to a second value.

In step S75, the delay line control circuit 640 may subtract the value of the delay control signal DC from the first delay code signal DSC1, set to the second value. In step S76, the first signal selector 642 may output the second delay code signal DSC2 as the clock delay setting signal CLDC, based on the second lock signal LOCK2, and the second signal selector 643 may output the first delay code signal DSC1 as the command delay setting signal CMDC, based on the second lock signal LOCK2. Therefore, the delay amount of the clock delay line 610 may be set, based on the clock delay setting signal CLDC having the first value, and the delay amount of the command delay line 650 may be set, based on the command delay setting signal CMDC, having a value obtained by subtracting the value of the delay control signal DC from the second value.

Referring to FIG. 8, the clock delay line 610 and the command delay line 650 may have the same maximum delay amount. When the first delay locking operation is completed, both of the clock delay line 610 and the command delay line 650 may be set to have a delay amount, corresponding to T1. When the second delay locking operation is completed, the clock delay line 610 may also be maintained to have the delay amount corresponding to T1. The command delay line 650 may have an additional delay amount, as well as the time T1, the additional delay amount corresponding to a time obtained by subtracting a time T3, corresponding to the delay control signal DC, from a time T2, corresponding to one period of the clock signal CLK and/or the delay clock signal CLKD. Therefore, the delay amount of the clock delay line 610 may be set to T1, and the delay amount of the command delay line 650 may be set to T1+T2−T3. The clock signal CLK may be delayed by the time T1 and outputted as the delay clock signal CLKD, and the internal command signal ICMD may be delayed by the time T1+T2−T3 and outputted as the output command signal CMDOE.

Figure 9:
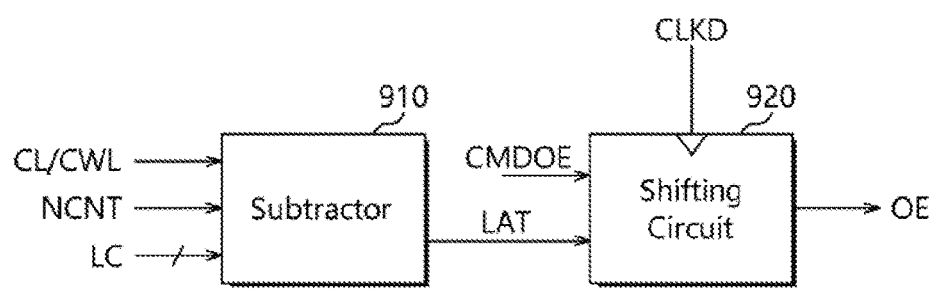
FIG. 9 is a diagram, illustrating a configuration of an output control circuit, illustrated in FIG. 1.

FIG. 9 is a diagram, illustrating the configuration of the output control circuit 140, illustrated in FIG. 1. In FIG. 9, the output control circuit 140 may include a subtractor 910 and a shifting circuit 920. The subtractor 910 may subtract the latency control signal LC from latency information CL/CWL and NCNT. The subtractor 910 may subtract the latency control signal LC from the latency information CL/CWL and NCNT, and output a latency signal LAT. The latency information may include the N count signal NCNT and one or more of the column address strobe latency CL and the column address strobe write latency CWL. The N counting signal NCNT may be a value, obtained by counting the delay amount of the clock delay line 610 based on the delay clock signal CLKD. The N counting signal NCNT may be a value, obtained by counting the delay amount, which is set while the first delay locking operation is performed, based on the delay clock signal CLKD. When the first delay locking operation is completed, the N counting signal NCNT may be generated through another internal circuit of the semiconductor apparatus 100, illustrated in FIG. 1. The subtractor 910 may generate the latency signal LAT by subtracting the N counting signal NCNT and the latency control signal LC from one or more of the column address strobe latency CL and the column address strobe write latency CWL.

The shifting circuit 920 may receive the output command signal CMDOE, the delay clock signal CLKD, and the latency signal LAT. The shifting circuit 920 may generate the output enable signal OE by delaying the output command signal CMDOE by a time, corresponding to the latency signal LAT, in synchronization with the delay clock signal CLKD. The shifting circuit 920 may sample the output command signal, using a falling edge of the delay clock signal CLKD, and generate the output enable signal OE, by delaying the output command CMDOE, by a multiple corresponding to the latency signal LAT of the delay clock signal CLKD. For example, when the column address strobe latency CL is 10, the value corresponding to the N counting signal NCNT is 2, and the value corresponding to the latency control signal LC is 3. The subtractor 910 may subtract 5 from 10, and generate the latency signal LAT having a value corresponding to 5. The values, corresponding to the column address strobe latency CL, the N counting signal NCNT, the latency control signal LC, and the latency signal LAT, may indicate multiples of the period of the delay clock signal CLKD. Therefore, the shifting circuit 920 may generate the output enable signal OE by delaying the output command signal CMDOE by five periods of the delay clock signal CLKD, in synchronization with the delay clock signal CLKD.

Figure 10:
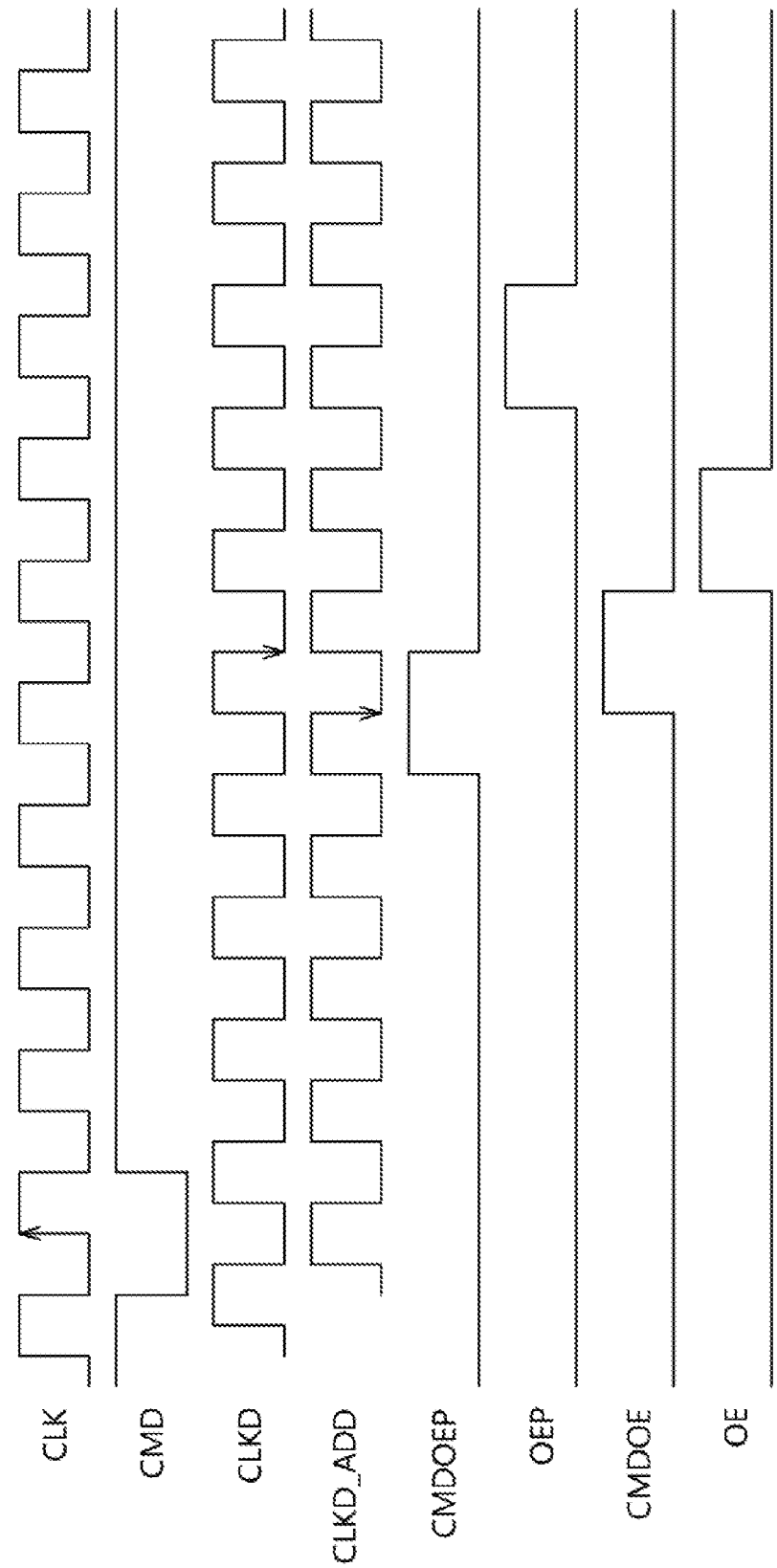
FIG. 10 is a diagram, illustrating an operation of a semiconductor apparatus, in accordance with an embodiment.

FIG. 10 is a diagram, illustrating the operation of the semiconductor apparatus 100, in accordance with the present embodiment. Referring to FIGS. 1 and 10, the operation of the semiconductor apparatus 100, in accordance with the present embodiment, will be described as follows. When the delay monitoring operation of the semiconductor apparatus 100 is performed, the delay amount of the clock delay circuit 111 of the clock path 110 and the delay amount of the command delay circuit 123 of the command path 120 may be set as illustrated in FIG. 8. When the command signal CMD is transferred from the outside of the semiconductor apparatus 100, while the semiconductor apparatus 100 performs a normal operation after the power-up interval is ended, the command decoding circuit 122 may latch the command signal CMD at a rising edge of the clock signal CLK. The command decoding circuit 122 may generate the internal command signal ICMD by decoding the latched command signal. The command delay circuit 123 may generate the output command signal CMDOE by delaying the internal command signal ICMD. The clock delay circuit 111 may generate the delay clock signal CLKD by delaying the clock signal CLK. Through the delay monitoring operation of the semiconductor apparatus 100, an edge of the output command signal CMDOE may be synchronized with an edge of the delay clock signal CLKD or positioned close to the edge of the delay clock signal CLKD. Hereafter, assume that the latency information CL/CWL and NCNT has a value corresponding to 3, and the latency control signal LC has a value corresponding to 2.

A general semiconductor apparatus does not perform the delay monitoring operation, but uses a method of matching the timings of an output command signal CMDOEP and an additional delay clock signal CLKD_ADD, obtained by additionally delaying the delay clock signal CLKD. In the general semiconductor apparatus, the delay amounts of the clock delay circuit and the command delay circuit are set to the same value. Therefore, a phase difference may be present between the delay clock signal CLKD and the output command signal CMDOEP. Therefore, the general semiconductor apparatus additionally delays the delay clock signal CLKD in order to convert the domain of the output command signal CMDOEP, and synchronizes the additional delay clock signal CLKD_ADD and the output command signal CMDOEP with each other. Furthermore, the general semiconductor apparatus may generate the output enable signal OE after the time, corresponding to the value of the latency information CL/CWL and NCNT elapses. The output command signal CMDOE may be sampled in synchronization with a falling edge of the additional delay clock signal CLK_ADD, and then outputted as the output enable signal OEP after a time corresponding to three periods of the additional delay clock signal CLK_ADD elapses.

In the semiconductor apparatus 100 in accordance with the present embodiment, however, an edge of the output command signal CMDOE may be close to an edge of the delay clock signal CLKD. Thus, the semiconductor apparatus 100 may have a sufficient margin for synchronizing the delay clock signal CLKD with the output command signal CMDOE, and perform an accurate domain conversion operation on the output command signal CMDOE using the delay clock signal CLKD. The output control circuit 140 may output the output enable signal OE after the time corresponding to the value obtained by subtracting the latency control signal LC from the latency information CL/CWL and NCNT elapses. The output command signal CMDOE may be sampled in synchronization with a falling edge of the delay clock signal CLKD, and then outputted as the output enable signal OE after a time corresponding one period of the delay clock signal CLKD elapses. Therefore, the semiconductor apparatus 100 in accordance with the present embodiment can output the output enable signal OE at an earlier time point than the general semiconductor apparatus.

While various embodiments have been described above, it will be understood to those skilled in the art that the embodiments described are examples only. Accordingly, the semiconductor apparatus described herein should not be limited based on the described embodiments.

What is claimed is:

1. A semiconductor apparatus comprising:
   a clock path configured to generate a delay clock signal by delaying a clock signal;
   a command path configured to generate an output command signal from one of a command signal and the clock signal, based on a monitoring signal;
   a delay monitoring circuit configured to generate a delay control signal and a latency control signal based on a phase difference between the delay clock signal and the output command signal, when the monitoring signal is enabled; and
   an output control circuit configured to generate an output enable signal by synchronizing the output command signal with the delay clock signal, based on the latency control signal.

2. The semiconductor apparatus according to claim 1, wherein the clock path comprises a clock delay circuit configured to generate the delay clock signal by performing a delay locking operation on the clock signal.

3. The semiconductor apparatus according to claim 2, wherein the command path comprises:
   a first gating circuit configured to replace one or more command signals based on the monitoring signal, and output the clock signal;
   a command decoding circuit configured to generate an internal command signal by decoding the output of the first gating circuit; and
   a command delay circuit configured to generate the output command signal by delaying the internal command signal, and have a delay amount which is set based on the delay locking operation and the delay control signal.

4. The semiconductor apparatus according to claim 3, wherein the clock path further comprises a second gating circuit configured to output the clock signal based on the monitoring signal.

5. The semiconductor apparatus according to claim 3, wherein the clock delay circuit performs a first delay locking operation to set the delay amounts of the clock delay circuit and the command delay circuit to the same value and then performs a second delay locking operation, and additionally sets the delay amount of the command delay circuit based on the delay control signal, when the second delay locking operation is completed.

6. The semiconductor apparatus according to claim 1, wherein the delay monitoring circuit counts the phase difference between the delay clock signal and the output command signal based on the delay clock signal and generates the latency control signal based on the counting result, and generates the delay control signal by converting a phase difference into a digital code, the phase difference being smaller than one period of the delay clock signal, among the phase difference between the delay clock signal and the output command signal.

7. The semiconductor apparatus according to claim 1, wherein the delay monitoring circuit comprises:
- a delay pulse generator configured to generate a delay pulse signal corresponding to a phase difference between the delay clock signal and the output command signal;
- a counting circuit configured to generate counting signals by counting the delay pulse signal according to the delay clock signal, and generate the latency control signal based on the counting signals;
- a shifter configured to generate shifted signals by shifting the delay pulse signal according to the delay clock signal; and
- a time-to-digital conversion circuit configured to generate a delay control signal corresponding to a pulse width smaller than one period of the delay clock signal among pulse width of the delay pulse signal, based on the delay pulse signal, the counting signals and the shifted signals.

8. The semiconductor apparatus according to claim 7, wherein the time-to-digital conversion circuit comprises:
- a summer configured to generate a first selection signal, a second selection signal, a first time input signal and a second time input signal from the delay pulse signal, based on the counting signal and the shifted signals;
- a first time-to-digital converter configured to generate a first output signal based on the first time input signal;
- a second time-to-digital converter configured to generate a second output signal based on the second time input signal; and
- a selector configured to output one of the first and second output signals as the delay control signal based on the first and second selection signals.

9. The semiconductor apparatus according to claim 8, wherein the summer generates the first selection signal and the first time input signal based on the odd-numbered counting signals, the odd-numbered shifted signals and the delay pulse signal, and generates the second selection signal and the second time input signal based on the even-numbered counting signals, the even-numbered shifted signals and the delay pulse signal.

10. The semiconductor apparatus according to claim 1, wherein the output control circuit comprises:
- a subtractor configured to generate a latency signal by subtracting the latency control signal and a portion of the latency information from the other portion of the latency information; and
- a shifting circuit configured to generate the output enable signal by shifting the output command signal by a time corresponding to the latency signal in synchronization with the delay clock signal.

11. A semiconductor apparatus comprising:
- a clock path configured to generate a delay clock signal, by delaying a clock signal, and configured to perform a first delay locking operation and a second delay locking operation on the clock signal;
- a command path configured to generate an internal command signal, by decoding a command signal, and configured to generate an output command signal by delaying the internal command signal;
- a delay monitoring circuit configured to generate a delay control signal and a latency control signal by monitoring a difference in delay amount between the clock path and the command path; and
- an output control circuit configured to generate an output enable signal by synchronizing the output command signal with the delay clock signal, based on the latency control signal.

12. The semiconductor apparatus according to claim 11, wherein the clock path comprises a clock delay circuit, wherein the clock delay circuit comprises:
- a clock delay line configured to generate the delay clock signal by delaying the clock signal based on a clock delay setting signal;
- a replica delay configured to generate a feedback clock signal by delaying the delay clock signal by a modeled delay amount;
- a phase detection circuit configured to generate a phase detection signal, a first lock signal and a second lock signal by comparing the phases of the clock signal and the feedback clock signal; and
- a delay line control circuit configured to generate the clock delay setting signal and a command delay setting signal based on the phase detection signal, the delay control signal, the first lock signal and the second lock signal.

13. The semiconductor apparatus according to claim 12, wherein the command path comprises:
- a command decoding circuit configured to generate the internal command signal by decoding the command signal; and
- a command delay line configured to generate the output command signal by delaying the internal command signal based on the command delay setting signal.

14. The semiconductor apparatus according to claim 12, wherein the delay line control circuit performs the first delay locking operation to set the clock delay setting signal and the command delay setting signal to the same value corresponding to a first value, performs the second delay locking operation to update the clock delay setting signal into a second value, and additionally sets the command delay setting signal based on the delay control signal and the clock delay setting signal having the second value, and sets the clock delay setting signal to the first value.

15. The semiconductor apparatus according to claim 12, wherein the delay line control circuit comprises:
- a delay controller configured to generate a first delay code signal and a second delay code signal based on the phase detection signal, the delay control signal, the first lock signal and the second lock signal;
- a first signal selector configured to output one of the first and second delay code signals as the clock delay setting signal based on the second lock signal; and
- a second signal selector configured to output one of the first and second delay code signals as the command delay setting signal based on the second lock signal.

16. The semiconductor apparatus according to claim 11, wherein the delay monitoring circuit counts a phase difference between the delay clock signal and the output command signal based on the delay clock signal and generates the latency control signal based on the counting result, and generates the delay control signal by converting a phase difference smaller than one period of the delay clock signal, among the phase difference between the delay clock signal and the output command signal, into a digital code.

17. The semiconductor apparatus according to claim 11, wherein the delay monitoring circuit comprises:
   a delay pulse generator configured to generate a delay pulse signal corresponding to a phase difference between the delay clock signal and the output command signal;
   a counting circuit configured to generate counting signals by counting the delay pulse signal based on the delay clock signal, and generate the latency control signal based on the counting signals;
   a shifter configured to generate shifted signals by shifting the delay pulse signal based on the delay clock signal; and
   a time-to-digital conversion circuit configured to generate a delay control signal corresponding to a pulse width smaller than one period of the delay clock signal among pulse widths of the delay pulse signal, based on the delay pulse signal, the counting signals and the shifted signals.

18. The semiconductor apparatus according to claim 17, wherein the time-to-digital conversion circuit comprises:
   a summer configured to generate a first selection signal, a second selection signal, a first time input signal and a second time input signal from the delay pulse signal, based on the counting signals and the shifted signals;
   a first time-to-digital converter configured to generate a first output signal based on the first time input signal;
   a second time-to-digital converter configured to generate a second output signal based on the second time input signal; and
   a selector configured to output one of the first and second output signals as the delay control signal based on the first and second selection signals.

19. The semiconductor apparatus according to claim 11, wherein the output control circuit comprises:
   a subtractor configured to generate a latency signal by subtracting the latency control signal and a portion of the latency information from the other portion of the latency information; and
   a shifting circuit configured to generate the output enable signal by shifting the output command signal by a time corresponding to the latency signal in synchronization with the delay clock signal.

20. An operation method of a semiconductor apparatus, comprising:
   generating a delay control signal and a latency control signal by monitoring a difference in delay amount between a clock path and a command path;
   performing a first delay locking operation on a clock signal to generate a first delay code signal and a second delay code signal, having a first value;
   performing a second delay locking operation on the clock signal to update the first delay code signal to a second value, and setting the first delay code signal based on the updated first delay code signal and the delay control signal;
   setting a delay amount of the clock path based on the second delay code signal, and setting a delay amount of the command path based on the first delay code signal; and
   synchronizing an output command signal, outputted from the command path, with a delay clock signal, outputted from the clock path, based on latency information and the latency control signal.

21. The operation method according to claim 20, wherein the generation of the delay control signal and the latency control signal, by monitoring the difference in delay amount, between the clock path and the command path, comprises:
   generating a delay pulse signal based on a phase difference between the delay clock signal and the output command signal;
   generating the latency control signal by counting the delay pulse signal based on the delay clock signal; and
   generating the delay control signal corresponding to a pulse width smaller than one period of the delay clock signal among pulse width of the delay pulse signal.

22. The operation method according to claim 21, wherein the synchronization of the output command signal, outputted from the command path, with the delay clock signal, outputted from the clock path, comprises:
   generating a latency signal by subtracting the latency control signal and a portion of the latency information from the other portion of the latency information; and
   generating an output enable signal by shifting the output command signal by a time corresponding to the latency signal in synchronization with the delay clock signal.

23. The operation method according to claim 20, wherein the performing of the first delay locking operation on the clock signal comprises:
   generating a feedback clock signal by delaying the delay clock signal by a modeled delay amount;
   generating a phase detection signal and a first lock signal by comparing the phases of the clock signal and the feedback clock signal; and
   generating the first and second delay code signals based on the phase detection signal, and retaining the values of the first and second delay code signals when the first lock signal is enabled.

24. The operation method according to claim 20, wherein the setting of the first delay code signal further comprises:
   subtracting the delay control signal from the updated first delay code signal.

25. The operation method according to claim 23, wherein the second delay locking operation is a harmonic delay locking operation.

* * * * *